United States Patent
Chen et al.

(10) Patent No.: US 7,651,893 B2
(45) Date of Patent: Jan. 26, 2010

(54) METAL ELECTRICAL FUSE STRUCTURE

(75) Inventors: Hsueh-Chung Chen, Yonghe (TW);
Hao-Yi Tsai, Hsin-Chu (TW);
Hsien-Wei Chen, Sinying (TW);
Shin-Puu Jeng, Hsin-Chu (TW);
Shang-Yun Hou, Jubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 393 days.

(21) Appl. No.: 11/320,233

(22) Filed: Dec. 27, 2005

(65) Prior Publication Data
US 2007/0145515 A1 Jun. 28, 2007

(51) Int. Cl.
*H01L 21/82* (2006.01)
(52) U.S. Cl. ............... 438/132; 257/529; 257/E23.149
(58) Field of Classification Search .............. 257/529, 257/E21.592, E23.147, E23.149; 438/132, 438/215, 467, 601, 140
See application file for complete search history.

(56) References Cited

U.S. PATENT DOCUMENTS

| | | | | |
|---|---|---|---|---|
| 4,774,561 | A * | 9/1988 | Takagi | 257/529 |
| 4,814,853 | A * | 3/1989 | Uchida | 257/530 |
| 5,538,924 | A * | 7/1996 | Chen | 438/132 |
| 5,869,379 | A * | 2/1999 | Gardner et al. | 438/305 |
| 6,774,457 | B2 | 8/2004 | Appel | |
| 7,242,072 | B2 * | 7/2007 | Kothandaraman et al. | 257/529 |
| 2003/0141568 | A1 * | 7/2003 | Sato et al. | 257/529 |
| 2005/0239273 | A1 * | 10/2005 | Yang | 438/601 |
| 2005/0285224 | A1 * | 12/2005 | Tsutsui | 257/531 |

* cited by examiner

*Primary Examiner*—Thao X Le
*Assistant Examiner*—Kimberly Trice
(74) *Attorney, Agent, or Firm*—Slater & Matsil, L.L.P.

(57) ABSTRACT

An electrical fuse and a method for forming the same are provided. The electrical fuse includes a dielectric layer over a shallow trench isolation region and a contact plug extending from a top surface of the dielectric layer to the shallow trench isolation region, wherein the contact plug comprises a middle portion substantially narrower than the two end portions. The contact plug forms a fuse element. The electrical fuse further includes two metal lines in a metallization layer on the dielectric layer, wherein each of the two metal lines is connected to different ones of the end portions of the contact plug.

13 Claims, 8 Drawing Sheets

METAL ELECTRICAL FUSE STRUCTURE

TECHNICAL FIELD

This invention relates generally to semiconductor structures, and more particularly to electrical fuses and a fabrication method thereof.

BACKGROUND

In the semiconductor industry, fuse elements are widely used in integrated circuits for a variety of purposes, such as improving manufacturing yield or customizing a generic integrated circuit. For example, by replacing defective circuits on a chip with duplicate or redundant circuits on the same chip, manufacturing yields can be significantly increased. A fuse disconnected by a laser beam is referred to as a laser fuse, while a fuse disconnected by passing an electrical current, or blowing, is referred to as an electrical fuse, or e-fuse. By selectively blowing fuses within an integrated circuit, which has multiple potential uses, a generic integrated circuit design may be economically manufactured and adapted to a variety of customer uses.

Typically, fuses are incorporated in the design of the integrated circuit, wherein the fuses are selectively blown, for example, by passing an electrical current of a sufficient magnitude to cause electromigration or melting, thereby creating a more resistive path or an open circuit. Alternatively, a current that is weaker than the current required to entirely blow the fuse can be applied in order to degrade the fuse, thus increasing a resistance through the fuse. The process of selectively blowing or degrading fuses is often referred to as "programming".

Laser fuses are widely used. However, they suffer scalability problems. A certain size is desired for accurate blowing, thus the laser fuses cannot be scaled proportionately with other devices. For the reason, electrical fuses are preferred for small-scale integrated circuits.

A commonly used electrical fuse is shown in FIG. 1. The fuse element is a polysilicon line 2 connected to metal lines 6 through vias 4. Polysilicon line 2 is doped to lower resistivity. A programming current causes heating in polysilicon line 2, and thus an open circuit is formed. This structure may suffer reliability problems, since the resistivity of polysilicon line 2 is determined by the doping concentration, and may vary from process to process. The program voltage and program time vary accordingly.

FIG. 2A illustrates a perspective view of another electrical fuse, which includes a polysilicon plate 12 connected to metal lines 16 and 18 through tungsten contact plugs 14a and 14b, respectively. Tungsten plug 14a has a relatively small cross-sectional area compared to contact plug 14b, and is used as a fuse element. When a program current passes from one metal line to another metal line, tungsten plug 14a is blown by a high current density. This embodiment suffers scalability problems. To ensure that via 14a is blown while via 14b remains intact, via 14b has to have a significantly greater cross-sectional area, for example, about five times greater, than that of via 14a. The entire fuse structure thus occupies a relatively great chip area.

FIG. 2B illustrates a variation of the fuse structure shown in FIG. 2A, wherein tungsten plugs 14a and 14b are replaced by a rectangular-shaped tungsten contact 19, which acts as a fuse element. A polysilicon plate 12 under the tungsten contact 19 is primarily used for landing the contact 19 and not for carrying fusing current.

A possible problem for the structure is that after the contact 19 is blown by heat and an open circuit forms, remaining heat may cause silicidation of tungsten with polysilicon plate 12, and a low resistivity path of silicide reconnects the disconnected parts. The reconnection may be in the form of shorting or degrading (with a relatively high resistive, but not completely open, path).

Therefore, there is the need for a highly reliable, scalable electrical fuse, particularly for integrated circuits fabricated using 90 nm technology and below.

SUMMARY OF THE INVENTION

The preferred embodiment of the present invention provides an electrical fuse and a method for forming the same.

In accordance with one aspect of the present invention, the electrical fuse includes a first dielectric layer over a shallow trench isolation region, a contact plug extending from a top surface of the first dielectric layer to the shallow trench isolation region, wherein the contact plug comprises a middle portion being substantially narrower than two end portions. The contact plug forms a fuse element. The electrical fuse further includes two metal lines in a second dielectric layer on the first dielectric layer, wherein each of the two metal lines connects to different ones of the end portions of the contact plug.

In accordance with another aspect of the present invention, a method for forming the preferred embodiments of the present invention includes forming a shallow trench isolation region, forming a first dielectric layer over the shallow trench isolation region, forming a contact plug extending from a top surface of the first dielectric layer to the shallow trench isolation region wherein the contact plug comprises a middle portion being substantially narrower than two end portions, forming a second dielectric layer over the first dielectric layer, and forming two metal lines in the second dielectric layer wherein each of the two metal lines is connected to different ones of the end portions of the contact plug. The method further includes forming a polysilicon strip to narrow the narrow portion of the contact plug. A guard line may be formed on each side of the contact plug to stop cracking caused by heat.

The advantageous features of the preferred embodiments of the present invention include improved reliability, high scalability and full compatibility with the existing integrated circuit formation processes.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The cross-sectional views, perspective views and top views of the intermediate stages in the manufacturing of the preferred embodiments of the present invention are illustrated in FIGS. 3 through 11. Throughout the various views and illustrative embodiments of the present invention, like reference numbers are used to designate like elements. Each figure number may be followed by a letter A or B, which letters indicate different variations or views.

Figure 1:
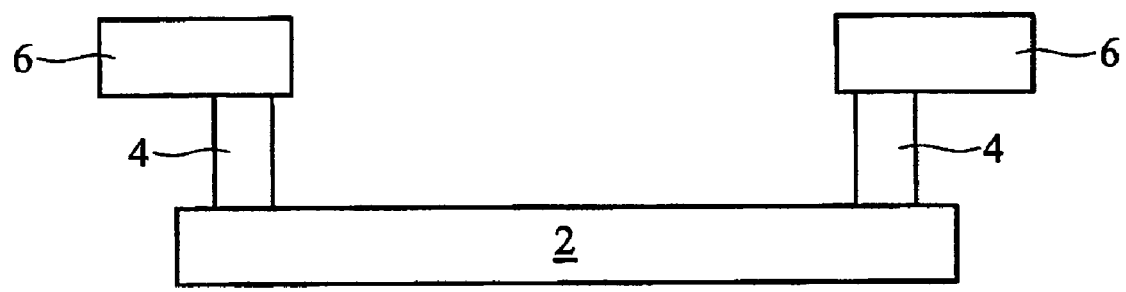
FIG. 1 illustrates a conventional electrical fuse, wherein a polysilicon line is used as a fuse element.
Figure 2A:
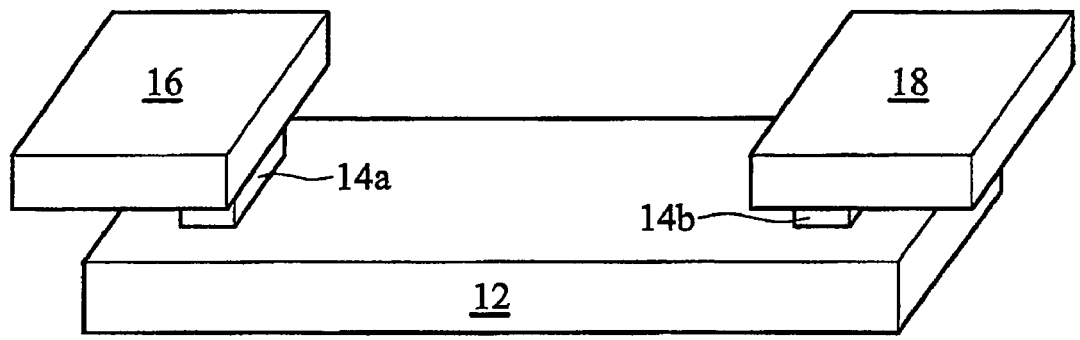
FIG. 2A illustrates a conventional electrical fuse, wherein a contact plug formed on a polysilicon plate is used as a fuse element.
Figure 2B:
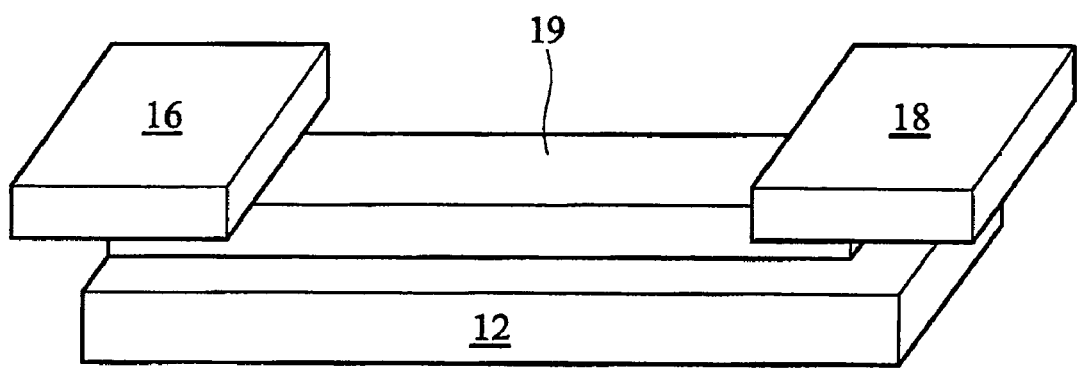
FIG. 2B illustrates a variation of the structure shown in FIG. 2A, wherein a contact plug strip formed on a polysilicon plate is used as a fuse element.
Figure 3A:
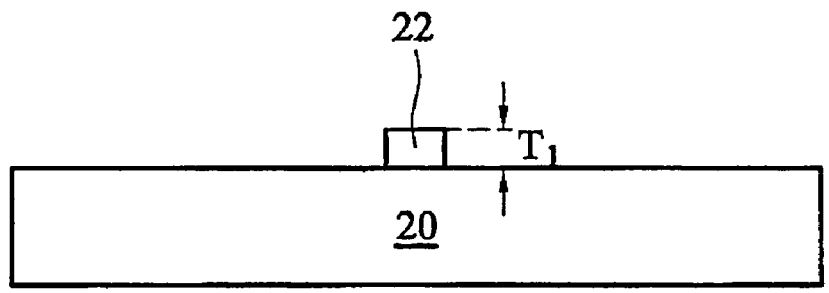
FIGS. 3 through 11 illustrate intermediate stages in the manufacture of a preferred embodiment.
Figure 3B:
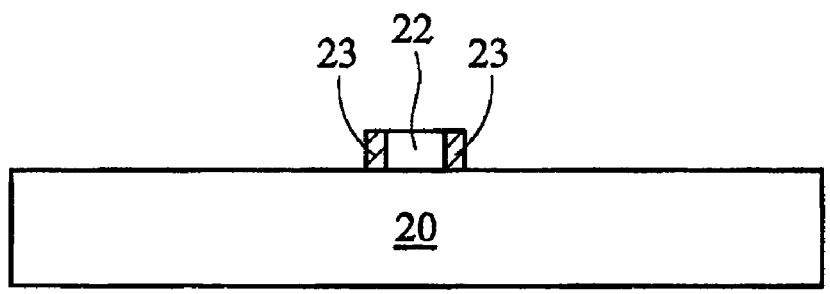
Figure 3C:
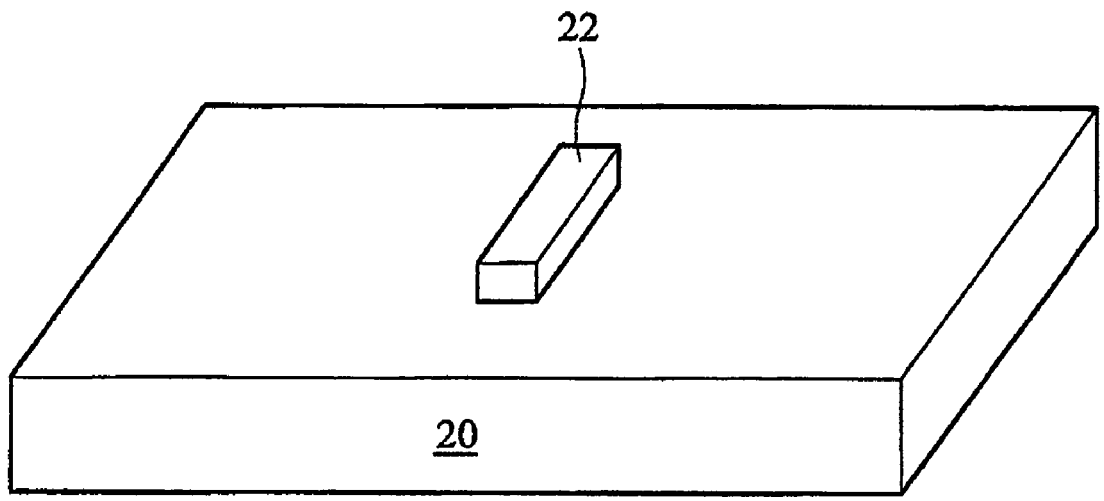

FIGS. 3A, 3B and 3C illustrate the formation of a polysilicon strip 22 on a dielectric isolation region 20, which is formed in a semiconductor substrate (not shown). Dielectric isolation region 20 is preferably a shallow trench isolation (STI) region, thus is alternatively referred to as STI region 20. FIG. 3A is a cross-sectional view. STI region 20 is preferably formed by forming a recess in the semiconductor substrate, and filling the recess with a dielectric material, such as $SiO_2$.

Preferably, the formation process for polysilicon strip 22 includes forming a silicon film on STI region 20, and removing undesired portions by etching. Although strip 22 is typically polycrystalline, thus is referred to as polysilicon strip 22, it may comprise amorphous silicon. Polysilicon strip 22 is preferably not doped so that it has a high resistivity. The thickness $T_1$, of the polysilicon strip 22 is preferably about 0.1 µm to about 1.0 µm.

The sidewalls of polysilicon strip 22 may further be protected by sidewall spacers 23, as shown in FIG. 3B, hence polysilicon strip 22 is isolated from the subsequently formed tungsten plug. Sidewall spacers 23 may be formed by forming an etch stop layer on polysilicon strip 22 and removing undesired portions. Alternatively, sidewall spacers 23 may be formed along with the formation of other sidewall spacers, for example, sidewall spacers for gate electrodes. Further, sidewall spacers 23 may extend on top of the polysilicon strip 22, completely isolating polysilicon strip 22 from overlying layers.

FIG. 3C illustrates a perspective view of the structure shown in FIG. 3A. Only one polysilicon strip 22 is shown. In alternative embodiments, more than one polysilicon strip 22 (refer to FIG. 11, which is a top view of the preferred embodiment) may be formed. Polysilicon strips 22 are preferably parallel to each other.

Figure 4:
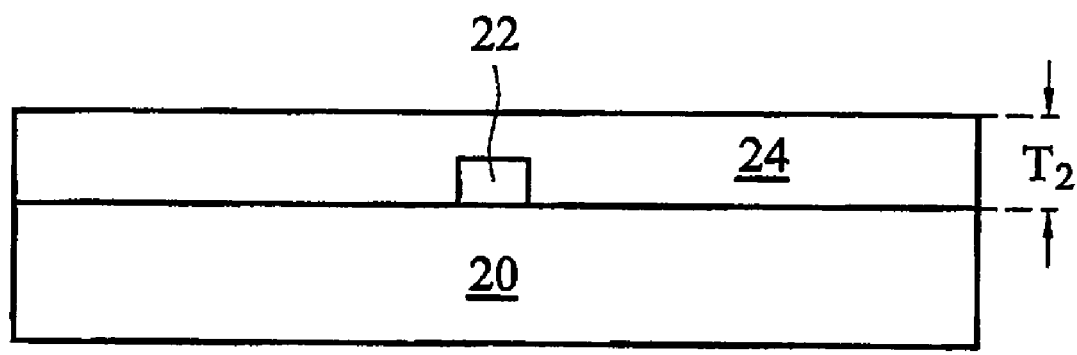

Referring to FIG. 4, a dielectric layer 24 is formed on STI region 20 and polysilicon strip 22. In the preferred embodiment, dielectric layer 24 is an inter-layer dielectric (ILD), thus preferably has a low dielectric constant of less than about 4.2. The thickness $T_2$ of the dielectric layer 24 is preferably determined by design rules and requirements of the integrated circuits. However, thickness $T_2$ needs to be greater than thickness $T_1$, of the polysilicon strip 22. In the preferred embodiment, the thickness $T_2$ is preferably less than about 1.0 µm. In other embodiments, dielectric layer 24 may further include other dielectric layers in addition to an inter-layer dielectric layer, for example, an etch stop layer.

Figure 5:
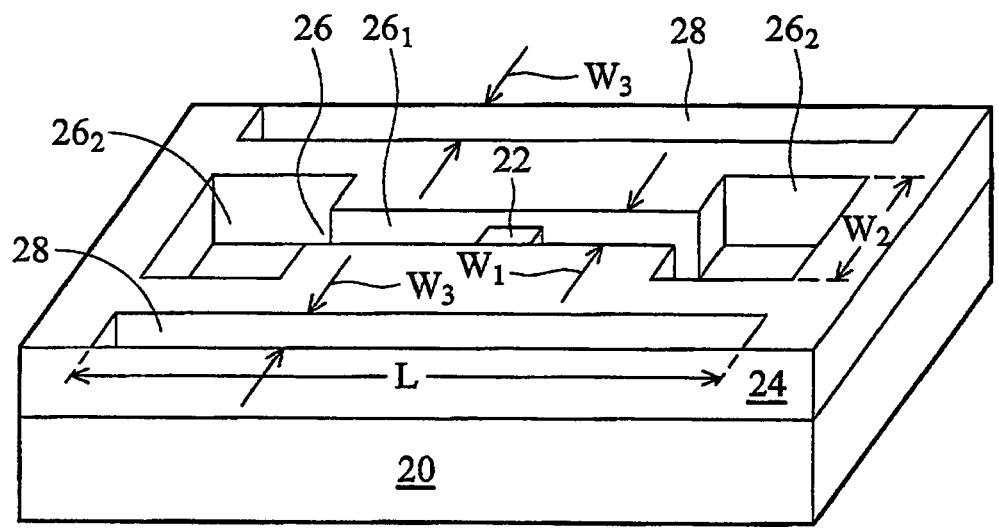

FIG. 5 illustrates a perspective view of the formation of contact openings 26 and 28 in dielectric layer 24. Preferably, a photo resist (not shown) is formed and patterned over the dielectric layer 24. Dielectric layer 24 is then etched to form contact openings 26 and 28, through which STI region 20 is exposed. Contact openings 28 define patterns for two subsequently formed guard lines, and contact opening 26 defines a pattern for a subsequently formed contact plug, which is also a fuse element. Preferably, openings 26 and 28 reach the bottom of dielectric layer 24. Polysilicon strip 22 is exposed through the opening 26.

Contact opening 26 has a dog-bone shape with a narrow portion $26_1$, in the middle and two wide portions $26_2$ at each end. Preferably, in the 90 nm technology, the narrow portion $26_1$, of the contact opening 26 has a width $W_1$ of less than about 1.0 µm, and more preferably between about 0.01 µm and about 0.5 µm. The wide portions $26_2$ of the contact opening 26 preferably have a width $W_2$ of between about 0.01 µm and about 10 µm. To create current crowding effects only in the narrow portion of the fuse element without affecting metal lines connected to fuses, $W_2$ and $W_1$ preferably have a ratio of greater than about 1.5. Openings 28 preferably have a width $W_3$ of between about 0.01 µm and about 10.0 µm, and a length L substantially equal to or greater than the length of the middle portion $26_1$, of the opening 26. One skilled in the art will realize that preferred widths $W_1$, $W_2$, and $W_3$ are related to the technology used, and will be reduced if the size of the integrated circuits is scaled down.

Figure 6:
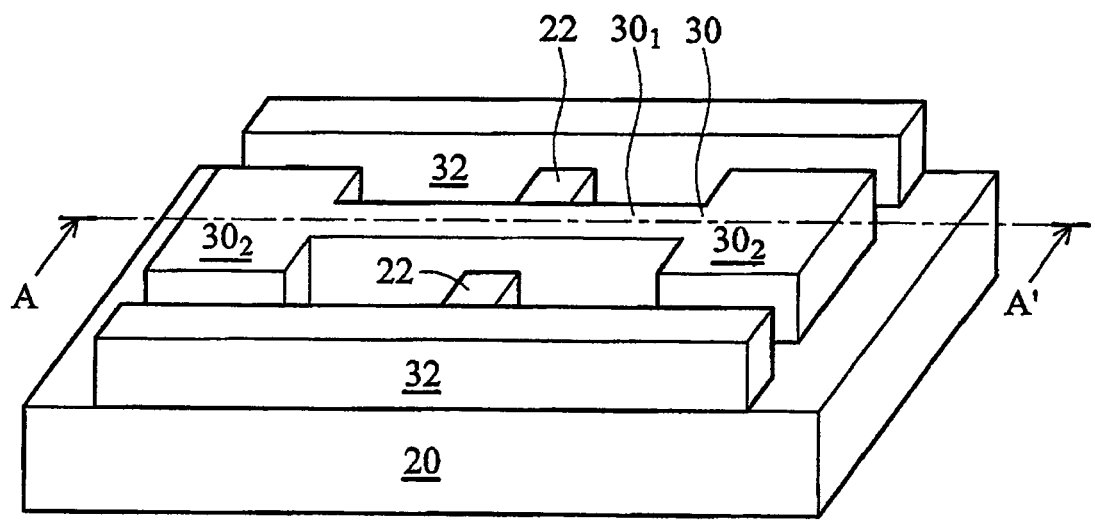

FIG. 6 illustrates a perspective view of the structure after metal plugs 30 and 32 have been formed in contact openings 26 and 28, respectively. Note that dielectric layer 24 is omitted for clear illustration purposes. Metal plugs 30 and 32 are preferably formed of tungsten. However, aluminum, copper, or other well-known alternatives and alloys can also be used. Metal plugs 30 and 32 may also have a composite structure, including, e.g., barrier and adhesion layers, such as titanium/titanium nitride or tantalum nitride, and other layers as well. Preferably, the barrier layer and adhesion layers comprise materials not prone to silicidation. Contact plug 30 forms a fuse element, thus is referred to as fuse element 30. Contact plugs 32 form guard lines.

When fuse element 30 is blown, heat generated by the current blowing the fuse element 30 may cause low-k dielectric layer 24 to crack. Guard lines 32 act as crack stoppers, preventing cracks from spreading to other regions. Therefore, it is preferred that guard lines 32 be adequately long to extend beyond a region where cracks may occur.

Figure 7:
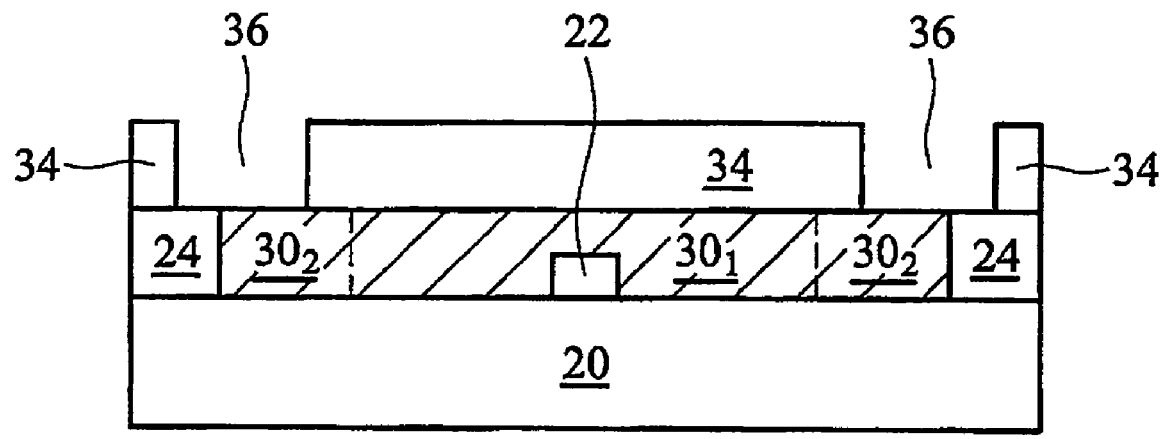
Figure 8:
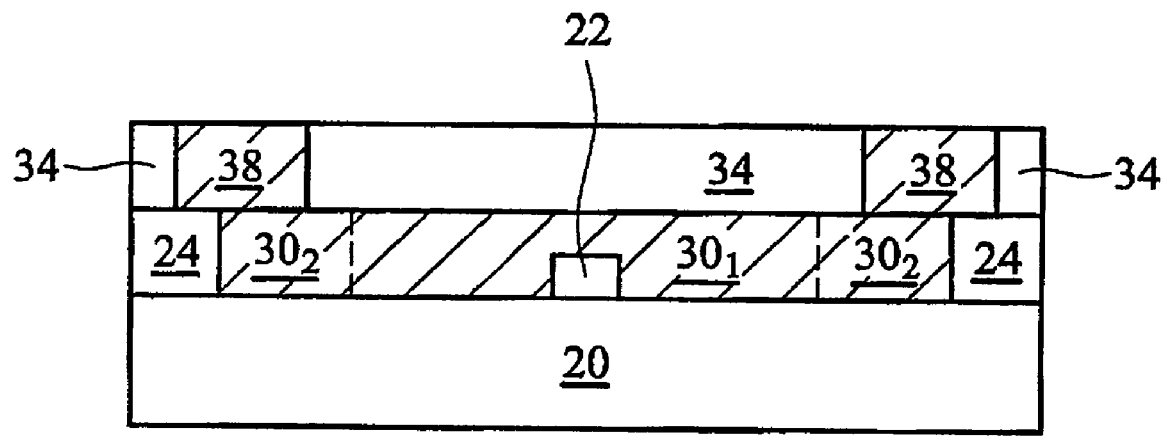

Connections to fuse element 30 are then formed, as shown in FIGS. 7 and 8. In the preferred embodiment, a single damascene process is used for the formation of metal lines. In other embodiments, a metal layer, for example, an aluminum layer, is deposited and etched to form metal lines. FIGS. 7 and 8 are cross-sectional views along a vertical plane crossing a line A-A' (refer to FIG. 6). In FIG. 7, a dielectric layer 34 is formed on dielectric layer 24, fuse element 30 and guard lines 32. Dielectric layer 34 is preferably a low-k dielectric layer having a k value of less than about 3.5, and more preferably an extreme low-k dielectric layer having a k value of less than about 2.5. Trenches 36 are then formed, exposing at least portions of the fuse element 30. Preferably, adequate portions of the wide portions $30_2$ of the fuse element 30 are exposed, while narrow portion $30_1$, is not exposed.

Referring to FIG. 8, metal lines 38 are formed in trenches 36. The material of the metal line 38 preferably comprises copper or copper alloys, although other materials such as aluminum or aluminum alloy can also be used. Preferably, a diffusion barrier layer (not shown) formed of a material comprising titanium, titanium nitride, tantalum, tantalum nitride, or other alternatives is formed in trenches 36 prior to the deposition of copper or copper alloys. Copper may be deposited by forming a thin layer of seed copper or copper alloy, then depositing copper on the seed layer to fill the trench 36. A chemical mechanical polish (CMP) is then performed to planarize the copper to the surface of dielectric layer 34.

Figure 9:
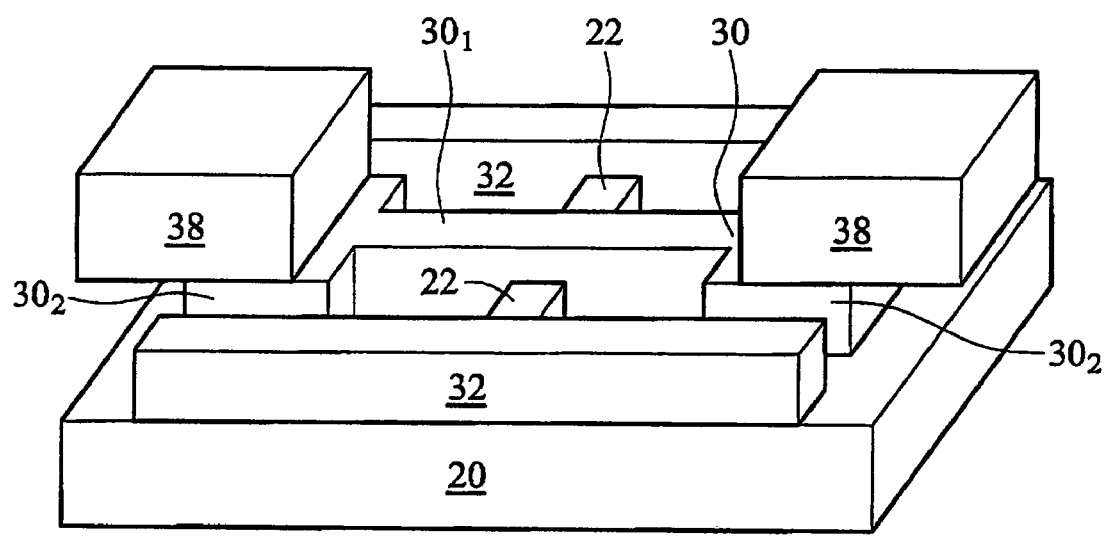
Figure 10:
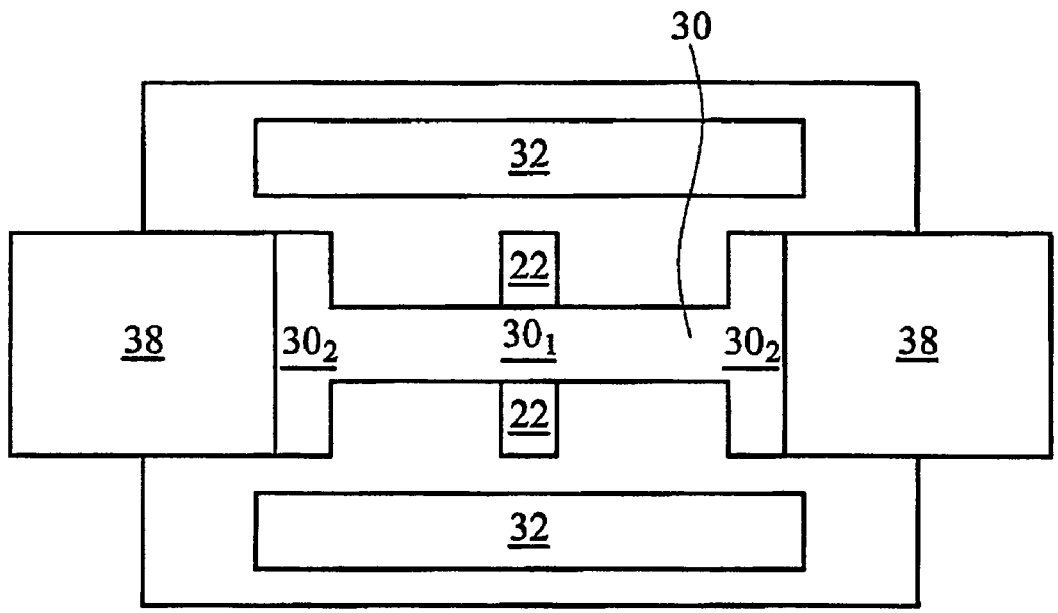
Figure 11:
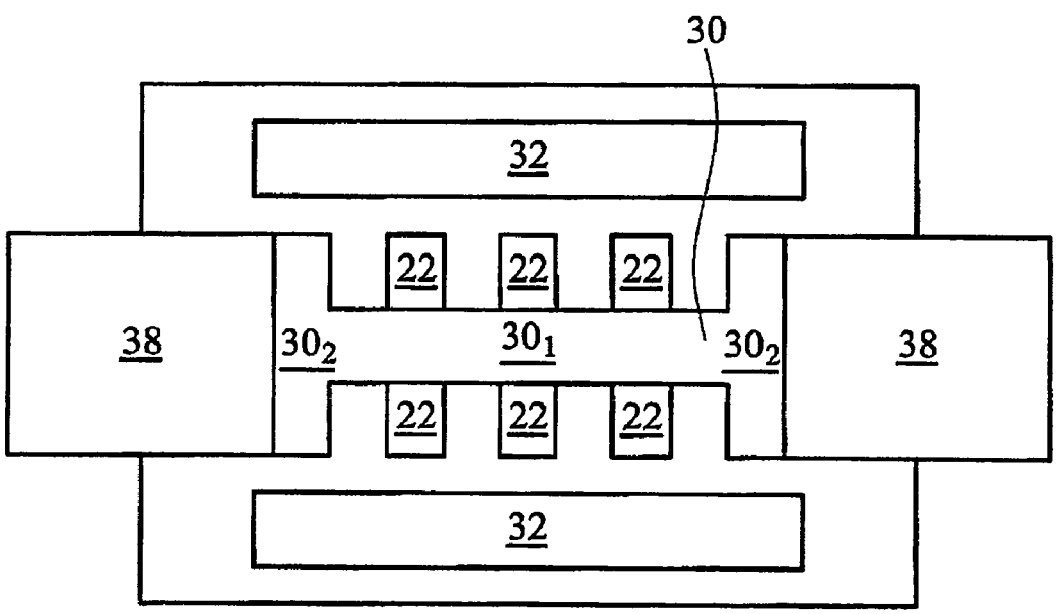

A preferred embodiment of the present invention is thus formed. A perspective view and a top view are illustrated in FIGS. 9 and 10, respectively. In the preferred embodiment, one polysilicon strip 22 is formed. In other embodiments, more than one polysilicon strip 22 is formed, and a top view is shown in FIG. 11.

When a program voltage is applied between metal lines 38, since the narrow portion $30_1$ of the fuse element 30 has a small width, current density in the narrow portion $30_1$ is high. The presence of polysilicon strip 22 further reduces the cross-sectional area of the narrow portion $30_1$ and deepens the current crowding effect, thus lower program voltage and/or shorter program time are required. In an exemplary embodiment, the width $W_1$ (refer to FIG. 5) and thickness $T_2$ (refer to FIG. 4) of the fuse element 30 are 0.13 µm and 0.4 µm, respectively. When a 1 volt program voltage is applied, causing about 0.01 to about 0.1 amps program current, the current density through the narrow portion $30_1$ of the fuse element 30 is about 2 A/µm$^2$. Assuming polysilicon strip 22 has a thickness $T_1$ of about 0.2 µm, the current density in the fuse region over polysilicon strip 22 further increases to about 5 A/µm$^2$.

The preferred embodiments of the present invention have several advantageous features. Firstly, the fuse element and its connecting metal lines have metal-to-metal contact. With improved contact and less contact resistance, less voltage drop occurs at the contact region and it is less likely that a burnout will occur at the contact region, thus the program voltage and program time are more controllable. Secondly, the preferred embodiments of the present invention are scalable with decreasing integrated circuit dimension and operation voltage. Thirdly, the preferred embodiments of the present invention are fully compatible with the existing integrated circuit fabrication processes, and the formation may be performed using the same masks as used for forming other semiconductor devices.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
    a first dielectric layer overlying a shallow trench isolation region;
    a contact plug having a middle portion, a first end portion, and a second end portion, each of the middle portion, the first end portion, and the second end portion extending from a top surface of the first dielectric layer to the shallow trench isolation region, the middle portion being substantially narrower than the first and the second end portions;
    a silicon strip overlying the shallow trench isolation region, wherein the silicon strip is perpendicular to a length direction of the contact plug, and wherein the contact plug wraps around a top surface and opposite sidewalls of a middle portion of the silicon strip; and
    two metal lines in a second dielectric layer overlying the first dielectric layer, wherein each of the two metal lines is connected to different ones of the end portions of the contact plug.

2. The semiconductor structure of claim 1 further comprising sidewall spacers on sidewalls of the silicon strip.

3. The semiconductor structure of claim 1 further comprising a guard line in the first dielectric layer, wherein the guard line is on a side of and parallel to the contact plug.

4. The semiconductor structure of claim 1, wherein the contact plug comprises tungsten.

5. The semiconductor structure of claim 1, wherein the first dielectric layer is directly on the shallow trench isolation region.

6. The semiconductor structure of claim 1, wherein the two end portions of the contact plug have a width greater than about 1.5 times a width of the middle portion.

7. The semiconductor structure of claim 1, wherein the first dielectric layer is an inter-layer dielectric.

8. The semiconductor structure of claim 1, wherein an entirety of the top surfaces of the middle portion and the end portions of the contact plug is substantially level with the top surface of the first dielectric layer.

9. The semiconductor structure of claim 1, wherein each of the middle portion and the end portions comprises a top portion and a bottom portion, and wherein the top portion and the bottom portion substantially have a same width.

10. The semiconductor structure of claim 1, wherein the sidewalls of the middle portion of the silicon strip adjoin the middle portion.

11. The semiconductor structure of claim 1, wherein bottom surfaces of the silicon strip and the contact plug adjoin the shallow trench isolation region.

12. A method for forming a semiconductor structure, the method comprising:
    forming a shallow trench isolation region;
    forming a first dielectric layer over the shallow trench isolation region;
    forming a contact plug having a middle portion, a first end portion, and a second end portion, each of the middle portion, the first end portion, and the second end portion extending from a top surface of the first dielectric layer to the shallow trench isolation region, the middle portion being substantially narrower than the first and the second end portions;
    forming a second dielectric layer over the first dielectric layer;
    before the step of forming the first dielectric layer, forming a polysilicon strip over the shallow trench isolation region, wherein the middle portion of the contact plug wraps around a top surface and opposite sidewalls of the polysilicon strip; and
    forming two metal lines in the second dielectric layer, wherein each of the two metal lines is connected to different ones of the end portions of the contact plug.

13. The method of claim 12 further comprising simultaneously forming a guard line on a side of the contact plug with the step of forming the contact plug.

* * * * *